(12) United States Patent
Ooiwa et al.

(10) Patent No.: US 10,141,466 B2
(45) Date of Patent: Nov. 27, 2018

(54) SUBSTRATE FOR SOLAR CELL, AND SOLAR CELL

(71) Applicant: SHIN-ETSU CHEMICAL CO., LTD., Tokyo (JP)

(72) Inventors: Hideo Ooiwa, Annaka (JP); Takenori Watabe, Annaka (JP); Hiroyuki Otsuka, Annaka (JP); Kazuo Hara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 554 days.

(21) Appl. No.: 14/943,390

(22) Filed: Nov. 17, 2015

(65) Prior Publication Data
US 2016/0141438 A1 May 19, 2016

Related U.S. Application Data

(62) Division of application No. 13/819,256, filed as application No. PCT/JP2011/068540 on Aug. 16, 2011.

(30) Foreign Application Priority Data

Aug. 26, 2010 (JP) .................. 2010-189213

(51) Int. Cl.
H01L 31/06 (2012.01)
H01L 31/065 (2012.01)
(Continued)

(52) U.S. Cl.
CPC .......... H01L 31/065 (2013.01); H01L 29/045 (2013.01); H01L 29/0657 (2013.01);
(Continued)

(58) Field of Classification Search
CPC ................ H01L 31/065; H01L 31/186; H01L 31/035281; H01L 31/022433;
(Continued)

(56) References Cited

U.S. PATENT DOCUMENTS 4,632,884 A 12/1986 Shikatani et al.
6,452,091 B1 9/2002 Nakagawa et al.
(Continued)

FOREIGN PATENT DOCUMENTS

CN 101523615 A 9/2009
CN 101533871 A 9/2009
(Continued)

OTHER PUBLICATIONS

Extended European Search Reaport dated Feb. 27, 2017 issued in Euporean Patent Application No. 11819820.9 (8 pages).
(Continued)

Primary Examiner — Selim Ahmed
(74) Attorney, Agent, or Firm — Westerman, Hattori, Daniels & Adrian, LLP

(57) ABSTRACT

Provided is a substrate for a solar cell, wherein a flat chamfered portion is formed on one corner of a silicon substrate having a square shape in a planar view, or a notch is formed on the corner or close to the corner. This invention makes it possible to easily check the position of the substrate and determine the direction of the substrate in a solar cell manufacturing step, and suppresses failures generated due to the direction of the substrate.

15 Claims, 2 Drawing Sheets

(51) Int. Cl.
  *H01L 31/068* (2012.01)
  *H01L 31/18* (2006.01)
  *H01L 29/06* (2006.01)
  *H01L 31/0352* (2006.01)
  *H01L 29/04* (2006.01)
  *H01L 31/0216* (2014.01)
  *H01L 31/0224* (2006.01)

(52) U.S. Cl.
  CPC ............ *H01L 31/02168* (2013.01); *H01L 31/022433* (2013.01); *H01L 31/0352* (2013.01); *H01L 31/035281* (2013.01); *H01L 31/068* (2013.01); *H01L 31/182* (2013.01); *H01L 31/186* (2013.01); *Y02E 10/546* (2013.01); *Y02E 10/547* (2013.01); *Y02P 70/521* (2015.11)

(58) Field of Classification Search
  CPC .......... H01L 31/02168; H01L 29/045; H01L 31/0352; H01L 29/0657; H01L 31/182; H01L 31/068; Y02P 70/521; Y02E 10/547; Y02E 10/546
  See application file for complete search history.

(56) References Cited

U.S. PATENT DOCUMENTS

| | | | |
|---|---|---|---|
| 6,482,661 | B1 | 11/2002 | Madoyski |
| 6,524,880 | B2 | 2/2003 | Moon et al. |
| 2004/0112426 | A1 | 6/2004 | Hagino |
| 2004/0188804 | A1 | 9/2004 | Nakayama et al. |
| 2009/0117680 | A1* | 5/2009 | Yamazaki ......... H01L 21/76254 438/57 |
| 2010/0193016 | A1* | 8/2010 | Fernandez ...... H01L 31/022425 136/255 |
| 2010/0237514 | A1 | 9/2010 | Richter et al. |

FOREIGN PATENT DOCUMENTS

| | | |
|---|---|---|
| JP | 57-173931 A | 10/1982 |
| JP | 59-104181 A | 6/1984 |
| JP | 2-130850 A | 5/1999 |
| JP | 11-297799 A | 10/1999 |
| JP | 2001-026500 A | 1/2001 |
| JP | 2001-085710 A | 3/2001 |
| JP | 2003-110041 A | 4/2003 |
| JP | 2004-064028 A | 2/2004 |
| JP | 2004-217491 A | 8/2004 |
| JP | 2005-123447 A | 5/2005 |
| JP | 2008-294364 A | 12/2008 |
| JP | 2008-294365 A | 12/2008 |
| JP | 2009-135464 A | 6/2009 |
| WO | 01/66361 A1 | 9/2001 |
| WO | 2008/151649 A1 | 12/2008 |

OTHER PUBLICATIONS

International Search Report of PCT/JP2011/068540, dated Sep. 13, 2011 (2 pages).
Written Opinion of PCT/JP2011/068540, dated Sep. 13, 2011 (4 pages).
Japanese Office Action dated Jul. 23, 2013, issude in corresponding Japanese Application No. 2010-189213 (12 pages).
Singaporean Office Action dated Mar. 27, 2014, issued in corresponding Singaporean Patent Application No. 2013014196 (10 pages).
Office Action dated Aug. 15, 2014, issued in corresponding Australian Patent Application No. 2011294367 (8 pages).
Office Action dated Mar. 30, 2015, issued in corresponding Chinese Patent Application No. 201180048928.1. w/ English translation. (18 pages).
Office Action dated Jul. 8, 2015, issued in counterpart Taiwanese application No. 100132634 (12 pages).

* cited by examiner

SUBSTRATE

OXIDE FILM FORMATION

DIFFUSION CHANNEL FORMATION

HIGH-CONCENTRATION DIFFUSION LAYER FORMATION

OXIDE FILM REMOVAL

LOW-CONCENTRATION DIFFUSION LAYER FORMATION

ANTIREFLECTIVE FILM

BACK SURFACE ELECTRODE FORMATION

FRONT SURFACE ELECTRODE FORMATION

SUBSTRATE FOR SOLAR CELL, AND SOLAR CELL

CROSS-REFERENCE TO RELATED APPLICATION

This application is a divisional of U.S. application Ser. No. 13/819,256, filed on Feb. 26, 2013, which is a 371 of International Application No. PCT/JP2011/068540, filed on Aug. 16, 2011, which claims the benefit of priority from the prior Japanese Patent Application No. 2010-189213, filed on Aug. 26, 2010, the entire contents of which are incorporated herein by reference.

TECHNICAL FIELD

This invention relates to solar cells for directly converting light energy into electricity, and substrates for solar cells.

BACKGROUND ART

It has been desired over the decades to overcome the problems associated with resource saving and environment pollution on the global scale. Apart from the nuclear power, development efforts were made on the technology of effectively utilizing the potential energy in wind, tide and sunlight as the replacement energy for fossil fuel, with some being commercially implemented.

Among others, a focus is put on solar cells as the main technology for the utilization of clean sunlight energy. Due to its capability of low cost, simple, and small-scale power generation, the solar power generation technology has been commercially utilized in houses and buildings to provide a partial replacement of the energy consumption therein.

In the current mainstream solar cell system for residential houses, a plurality of panel-like solar cell modules are connected in series or parallel and arrayed and installed on the roof so that the desired power may be produced. The solar cells used in the panel-like solar cell modules are shaped square or pseudo-square with cut corners so as to conform to the shape of the solar cell panel.

The solar cell is a semiconductor device for converting light energy into electricity and includes p-n junction type, pin type and Schottky type, with the p-n junction type being on widespread use. When classified in terms of substrate material, the solar cell is generally classified into three categories, crystalline silicon solar cells, amorphous silicon solar cells, and compound semiconductor solar cells. The crystalline silicon solar cells are sub-divided into monocrystalline and polycrystalline solar cells. The crystalline silicon solar cells become most widespread since crystalline substrates for solar cells can be relatively easily manufactured.

In general crystalline silicon solar cells, a p-n junction must be formed to separate carriers created by irradiation of sunlight. In one example where the substrate used is p-type silicon, an n-type silicon layer is formed on the light-receiving surface by diffusing a Group V element such as phosphorus. In another example where the substrate used is n-type silicon, a p-type silicon layer is formed on the light-receiving surface by diffusing a Group III element such as boron.

The silicon solar cell is manufactured from a p-type silicon substrate, for example, by thermal diffusion of a dopant like phosphorus at a temperature of about 800 to 950° C. to form diffusion layers on both the entire surfaces of the substrate. If desired, an unnecessary portion of the diffusion layer is removed, and the remaining layer serves as the diffusion layer in the solar cell.

Then an antireflective coating, for example, silicon nitride film is formed on the diffusion layer. Silver paste in grid pattern on the light-receiving surface and aluminum paste on the substantially entire back surface are printed and fired to form electrodes, yielding a crystalline silicon solar cell.

From the standpoint of increasing the photovoltaic conversion of a solar cell, a thinner diffusion layer is better. However, too thin a thickness leads to a likelihood of breakage of n-type layer by the electrode, known as punch-through, and current collection at the electrode is inhibited due to an increased resistance. Therefore, the structure known as "selective emitter" is used in which the diffusion layer is thin in the light-receiving surface area as a high resistance layer (low concentration diffusion) and thick in the electrode area as a low resistance layer (high concentration diffusion).

The selective emitter may be prepared by covering the surface of a substrate with an anti-diffusion coating such as $SiO_2$, removing lines of the anti-diffusion coating to open diffusion windows, and selectively diffusing a dopant into the window region to form a high-concentration diffusion layer.

After the high-concentration diffusion layer is formed, the anti-diffusion coating is removed, and the dopant is diffused into the entire surface including the high-concentration diffusion layer, so that the region surrounding the high-concentration diffusion layer may become a low-concentration diffusion layer having a lower dopant concentration than the high-concentration diffusion layer.

Next, an antireflective coating is formed on the surface. The ARC may be a silicon nitride, titanium oxide or aluminum oxide film. Such a film may be formed by CVD, for example.

The silicon oxide, silicon nitride, titanium oxide and aluminum oxide films used as the ARC all serve to terminate defects on the silicon wafer surface and improve the properties, especially short-circuit current of solar cells.

After the ARC is formed, electrode fingers are formed by printing. The position of electrode fingers is determined by registering the substrate in place using its two sides as the reference, and aligning the fingers with the high-concentration diffusion layer.

After the diffusion treatment, the low-concentration diffusion layer and the high-concentration diffusion layer cannot be discriminated by visual observation. This discrimination is possible by electrical evaluation, for example, measurement of spreading resistance, which is a destructive, time-consuming test.

Since the solar cell manufacture process involves many steps as mentioned above, there arises a problem that if the substrate is rotated in a certain step, then the orientation of the substrate can no longer be identified. To avoid such inconvenience, the substrate may be provided with a mark by laser marking, but the mark is difficultly ascertained after an ARC is formed thereon. An additional problem of laser marking is that the solar substrate is distorted thereby, with properties of the relevant portion being degraded.

The prior art references pertinent to the present invention include the following documents.

CITATION LIST

Patent Document

Patent Document 1: JP-A 2004-064028
Patent Document 2: JP-A 2005-123447

SUMMARY OF INVENTION

Technical Problem

An object of the invention, which is made under the above circumstances, is to provide a substrate in which the direction of the substrate is easily identifiable, and the direction of the substrate can be easily kept in register throughout the process of manufacturing a solar cell so that a solar cell with consistent properties may be manufactured.

Solution to Problem

Accordingly, the present invention provides a solar cell-forming substrate and a solar cell, as defined below.

[1] A solar cell-forming silicon substrate of square shape with corners as viewed in plan view, which is provided with a chamfer at one corner or a notch at or near one corner.

[2] A solar cell-forming silicon substrate of square shape as viewed in plan view, having a first corner and a second corner not diagonal to the first corner, which is provided with a chamfer at the first corner or a notch at or near the first corner and with a notch at or near the second corner or a chamfer at the second corner, the notch or chamfer at the second corner is selected to be different from the chamfer or notch at the first corner.

[3] A solar cell-forming monocrystalline silicon substrate of square shape with rounded corners as viewed in plan view, which is provided with an orientation flat at one corner or a notch at or near one corner.

[4] A solar cell-forming monocrystalline silicon substrate of square shape with rounded corners as viewed in plan view, having a surface in (100) plane, which substrate is provided with an orientation flat or notch in a crystal orientation <110> passing substantially the center of the substrate.

[5] A solar cell-forming monocrystalline silicon substrate of square shape with rounded corners as viewed in plan view, which is provided with an orientation flat at one corner and a notch at or near another corner not diagonal to the one corner.

[6] A solar cell comprising the substrate of any one of [1] to [5], wherein a low-concentration diffusion layer is formed on the light-receiving surface of the substrate, and a high-concentration diffusion layer is formed where a finger electrode is to be formed.

As used herein, the term "at or near a corner" refers to not only a right-angled corner of a square or a point at the center of a rounded corner, but also a surrounding portion, and encompasses a rounded portion.

Advantageous Effects of Invention

Since the position of a substrate is easily ascertainable according to the invention, the direction of the substrate can be easily identified in the process of manufacturing a solar cell, suppressing formation of failures associated with the direction of the substrate.

DESCRIPTION OF EMBODIMENTS

Figure 1A:
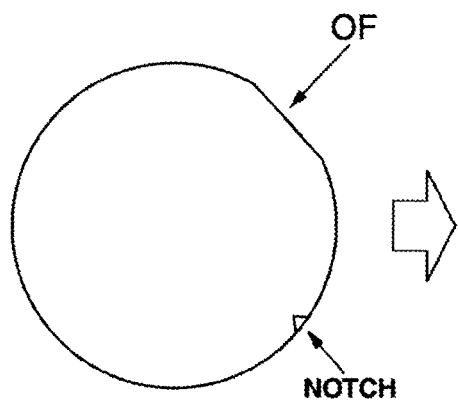
FIGS. 1A and 1B illustrate one exemplary solar cell-forming substrate according to the invention, FIG. 1A being a plan view of a cylindrical monocrystalline ingot provided with an orientation flat, and FIG. 1B being a plan view of a substrate which is worked into a pseudo-square shape as viewed in plan view by cutting off peripheral portions.
Figure 1B:
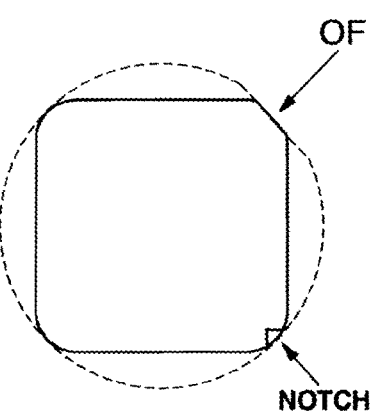
Figure 2A:
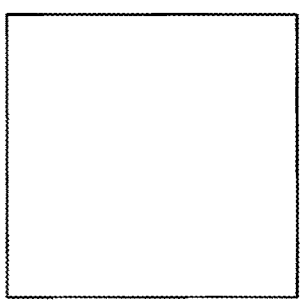
FIGS. 2A and 2B illustrate another exemplary solar cell-forming substrate according to the invention, FIG. 2A being a plan view of polycrystalline silicon prepared by the casting method, and FIG. 2B being a plan view of a substrate provided with a chamfer and a notch at corners.

Since the shape of a solar cell should conform to the shape of a solar cell panel, its substrate is worked into a square or pseudo-square shape as viewed in plan view, the pseudo-square shape referring to a square shape with rounded corners (see FIG. 1B). The substrate is worked into a pseudo-square shape in order to reduce a loss of monocrystal material by cutting when a monocrystalline substrate is obtained from cylindrical monocrystal. In the case of a polycrystalline substrate, a substrate of square shape (see FIG. 2A) is used since the shape can be changed by a mold.

According to the invention, the substrate is provided with a flat chamfer at a first corner or a notch at or near a first corner. Then the first corner has a different shape from other corners whereby the direction of the substrate can be judged.

In the case of a square substrate, the machined portion preferably has an outline size of up to 5 mm in order to minimize a loss of material associated with the chamfer or notch machining.

In the case of a pseudo-square substrate, for example, a pseudo-square substrate of 156×156 mm is obtainable from a cylindrical monocrystalline ingot having a diameter of 200 mm, with each corner being an arc having a radius of 100 mm. One arcuate portion is provided with an orientation flat representative of cleavage direction (flat chamfer indicating crystal direction, abbreviated as OF, hereinafter) or a notch.

With respect to the number of OF's or notches machined, only one is sufficient to identify the direction of the substrate. If an OF and a notch are combined and disposed so as to be asymmetric with respect to a diagonal line of the substrate, then front and back surfaces can be discriminated.

First Embodiment

Referring to FIGS. 1A and 1B, and 3A to 3I, the process of manufacturing a solar cell using a monocrystalline silicon substrate resulting from the CZ method is described.

Crystalline silicon substrates for use in monocrystalline solar cells are generally prepared by the floating zone (FZ) method and the Czochralski (CZ) method, with the CZ method being predominant.

First, a quartz crucible is charged with high-purity polycrystalline silicon. Next, to produce a single crystal having the desired conductivity type and resistivity, the silicon is doped with a Group III element such as boron or gallium to create p-type or with a Group V element such as phosphorus or arsenic to create n-type. A resistivity of 0.1 Ω-cm to 10 Ω-cm, desirably 0.5 Ω-cm to 2 Ω-cm is appropriate for establishing high-performance solar cells.

A seed crystal having plane orientation in <100> direction is immersed in the melt and pulled up while rotating, yielding a cylindrical monocrystalline ingot having plane orientation <100>. The monocrystalline ingot is worked into a cylindrical block by cutting off opposite ends of the ingot and grinding the outer periphery.

The monocrystalline ingot having plane orientation <100> is measured for crystal orientation by X-ray orientation measurement. It is machined to form an OF or notch in <110> direction passing the center of monocrystal and corresponding to cleavage direction (see FIG. 1A).

Next, in order to convert cylinder to nearly square, the cylindrical ingot is worked into a square or pseudo-square shape by cutting off peripheral portions (see FIG. 1B). This cutting is carried out after rotating 45 degrees relative to <110> direction corresponding to cleavage direction, so that the OF or notch is left. In the case of a square substrate, the machined portion desirably has an outline size of up to 5 mm in order to minimize a loss of material associated with the OF or notch machining. As used herein, the outline size refers to the length of a chord chamfered in the case of an OF or the length of a major side notched in the case of a notch.

With respect to the number of OF's or notches machined, only one is sufficient to identify the direction of the substrate. If an OF and a notch are combined (at least two features combined) and disposed so as to be asymmetric with respect to a diagonal line of the substrate, then a benefit is obtained that front and back surfaces can be discriminated.

With carbon, glass or the like bonded, a columnar block of pseudo-square shape is sliced to the predetermined substrate thickness. With respect to the substrate thickness, although a thickness of the order of 50 µm is able to capture incident light within the solar cell and is economically advantageous, a thickness of 150 to 300 µm is desirable for mechanical strength.

Before the cut block is sliced into solar cell-forming substrates, the method of cutting along cleavage direction gives rise to problems of cracking and chipping. The problems of cracking and chipping upon cutting may be avoided by rotating 45 degrees with respect to the cleavage direction, and cutting such that the OF or notch is positioned at or near a corner of pseudo-square shape.

The sliced substrate 1 (FIG. 3A) is transferred to a carrier for cleaning where it is cleaned. When a substrate of 156 mm squares is prepared from a monocrystalline ingot of 200 mm diameter, the diameter has a deviation of about 0.5 to 0.7 mm depending on whether or not the OF is provided, and the direction of the substrate can be aligned via visual observation. Alternatively, a CCD camera is used to judge the shape of the substrate, the carrier is loaded with the substrate with its direction changed, so that the direction of the OF or notch is kept identical. This can eliminate any failures arising from a difference in the direction of the substrate during the process.

Figure 3A:
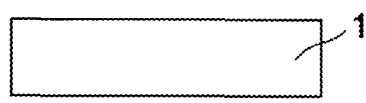
FIGS. 3A to 3I illustrate successive steps of a solar cell manufacturing process.
Figure 3B:
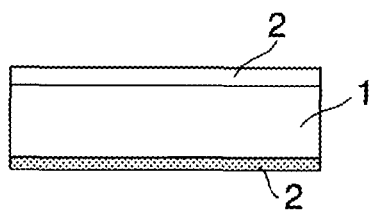

The substrate as cleaned is subjected to thermal oxidation in an oxygen atmosphere in a hot oven at 800 to 1,000° C., forming a thin silicon oxide film 2 of about 3 to 30 nm thick on the light-receiving surface of the substrate (FIG. 3B).

Figure 3C:
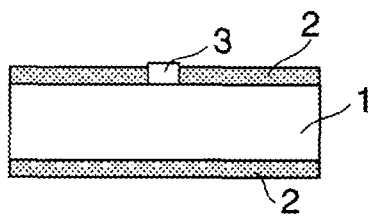

Next, a photoresist material is spin coated to the light-receiving surface of the substrate and baked at 70 to 100° C. for about 20 to 80 minutes. The resist is exposed to light through a glass mask having the same pattern as the light-receiving surface electrode pattern and developed. The photoresist material used herein may be either positive or negative. The thus patterned substrate is immersed in a hydrofluoric acid aqueous solution of about 1 to 50% by weight or a mixed aqueous solution of hydrofluoric acid and ammonium fluoride, whereby in the case of positive photoresist material, the silicon oxide film 2 is removed only where the photoresist film has been removed. That is, a portion of the silicon oxide film which has the same pattern as the light-receiving surface electrode is lost, forming a diffusion channel 3. Thereafter, the resist film is completely removed by acetone dipping, sulfuric acid boiling or the like (FIG. 3C).

Figure 3D:
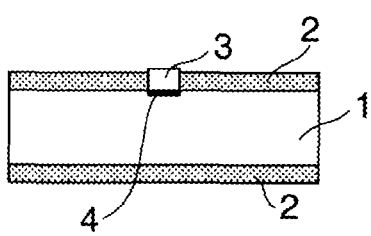

As first diffusion treatment on the light-receiving surface of the substrate, $POCl_3$-containing $N_2$ gas is fed to a hot oven at 900 to 950° C., for carrying out diffusion treatment 4 with phosphorus, Group V element as dopant (FIG. 3D). At this point, phosphorus can be selectively diffused since the oxide film remaining on the surface serves as a mask against phosphorus diffusion. In handling of the substrate, the OF and notch on the substrate enables to identify the direction of the substrate and discriminate the front and back surfaces.

It is noted that the above step may also be performed by coating/diffusion or ion implantation.

Figure 3E:
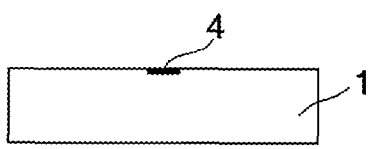

At the end of the first diffusion treatment, etching is performed with a hydrofluoric acid aqueous solution of about 1 to 50% by weight to remove the surface oxide films (FIG. 3E). When the substrate is transferred from the quartz jig for heat treatment to the cleaning carrier, the OF and notch on the substrate enables to identify the direction of the substrate and discriminate the front and back surfaces.

Figure 3F:
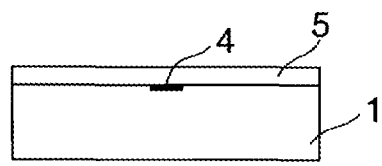

After the oxide films are removed, as second diffusion heat treatment, $POCl_3$-containing $N_2$ gas is fed to a hot oven at 800 to 850° C., for carrying out diffusion treatment 5 with phosphorus, Group V element as dopant in a low concentration over the entire surface (FIG. 3F). The low concentration diffusion layer 5 is formed so as to have a sheet resistance of $50\Omega/\square$ to $300\Omega/\square$, typically $100\Omega/\square$. With this second diffusion heat treatment, the dopant is additionally diffused into the high-concentration diffusion layer 4 pre-formed by the first diffusion heat treatment, which becomes a high-concentration diffusion layer 4 having a sheet resistance of $1\Omega/\square$ to $50\Omega/\square$, typically $10\Omega/\square$. Like the first diffusion treatment, this step may also be performed by coating/diffusion or ion implantation. When the substrate is transferred from the cleaning carrier to the quartz jig for heat treatment, the OF and notch on the substrate enables to identify the direction of the substrate and discriminate the front and back surfaces.

Figure 3G:
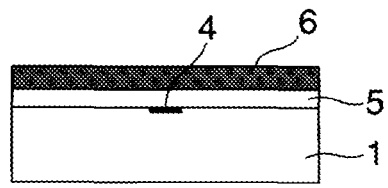

At the end of the second diffusion treatment, a silicon nitride film is deposited on the substrate surface by plasma-enhanced CVD as an antireflective film 6 which serves for preventing reflection of sunlight and for surface protection (FIG. 3G).

Figure 3H:
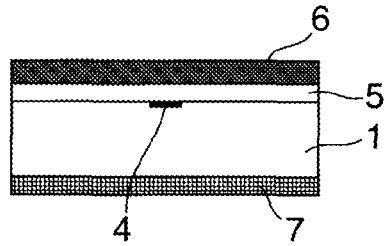

On the back surface of the substrate having the silicon nitride film formed thereon, a back surface electrode 7 is formed by vacuum deposition or sputtering of aluminum or the like. The back surface electrode 7 is formed, for example, to a thickness of 1 µm to 10 µm, typically 5 µm (FIG. 3H).

Figure 3I:
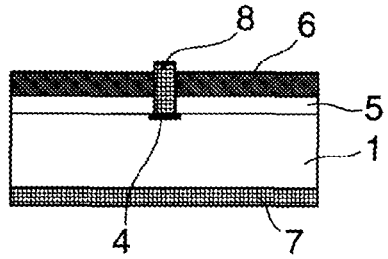

Finally, an electrode paste is printed on the front surface and fired at 500 to 800° C. to form an electrode 8 (FIG. 3I). At this point, the finger electrode is formed to overlay the high-concentration diffusion layer. Although the process involving many transfer steps has the problem that it is impossible to discriminate the high-concentration diffusion layer 4 and the low-concentration diffusion layer 5 by visual observation and to identify the direction of the substrate, the provision of OF and notch according to the invention enables to set the direction of the substrate in register and thus enables to manufacture solar cells in high yields.

Second Embodiment

Referring to FIGS. 2A and 2B, and 3A to 3I, the process of manufacturing a solar cell using a polycrystalline silicon substrate resulting from the casting method is described.

Crystalline silicon substrates for use in polycrystalline solar cells are generally prepared by the casting method. First, metallurgical grade microparticulate silicon is admitted together with dopant into a high-purity quartz crucible (lined with parting agent) in a casting furnace. Since the dopant is selected so as to produce polycrystalline silicon of the desired conductivity type and resistivity, the silicon may be doped with a Group III element such as boron or gallium to create p-type or a Group V element such as phosphorus or arsenic to create n-type. A resistivity of 0.1 Ω-cm to 10 Ω-cm, desirably 0.5 Ω-cm to 2 Ω-cm is appropriate for establishing high-performance solar cells. A heater is actuated to heat the crucible at a temperature of about 1,500° C. for melting the metallurgical grade silicon.

Next, the heater is controlled so that the temperature of a lower portion may be low. The molten metallurgical grade silicon is solidified from below, obtaining a casting of polycrystalline silicon. The crucible is taken out of the casting furnace, and the solidified casting of polycrystalline silicon taken out of the crucible. Side, bottom and top surface portions of this polycrystalline silicon casting are cut off since these portions are rich in impurities. In the case of a cubic polycrystalline silicon casting of 200 mm, for example, a side portion of 25 mm, a bottom portion of 20 mm, and a top portion of 30 mm are cut off. The top portion is cut off to a relatively large extent because impurities concentrate at the top due to segregation in the course of the casting solidifying from below.

Figure 2B:
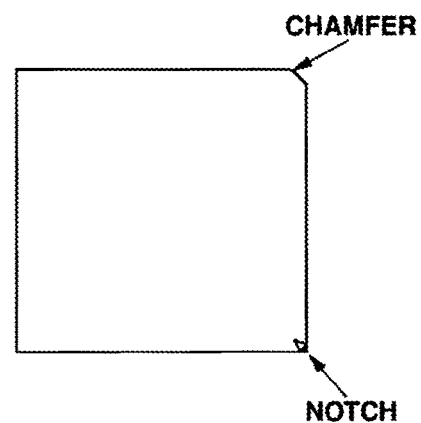

After the side, bottom and top surface portions are cut off, the polycrystalline silicon casting (see FIG. 2A) is provided with a flat chamfer at a corner or a notch at or near a corner by machining (see FIG. 2B). At this point, the machined portion desirably has an outline size of up to 5 mm in order to minimize a loss of material associated with the chamfer or notch machining.

With respect to the number of chamfers or notches machined, only one is sufficient to identify the direction of the substrate. If a chamfer and a notch are combined (at least two features combined) and disposed so as to be asymmetric with respect to a diagonal line of a pseudo-square shape, then a benefit is obtained that front and back surfaces can be discriminated.

With carbon, glass or the like bonded, a columnar block of square shape is sliced to the predetermined substrate thickness. With respect to the substrate thickness, although a thickness of the order of 50 µm is able to capture incident light within the solar cell and is economically advantageous, a thickness of 150 to 300 µm is desirable for mechanical strength.

The sliced substrate 1 (FIG. 3A) is transferred to a carrier for cleaning where it is cleaned. At this point, if the chamfer or notch provided according to the invention is confirmed by visual observation, then the direction of the substrate can be aligned. Alternatively, a CCD camera is used to judge the shape of the substrate, the carrier is loaded with the substrate with its direction changed, so that the direction of the chamfer and notch is kept identical. This can eliminate any failures arising from a difference in the direction of the substrate during the process.

The substrate as cleaned is subjected to thermal oxidation in an oxygen atmosphere in a hot oven at 800 to 1,000° C., forming a thin silicon oxide film 2 of about 3 to 30 nm thick on the light-receiving surface of the substrate (FIG. 3B).

Next, a photoresist material is spin coated to the light-receiving surface of the substrate and baked at 70 to 100° C. for about 20 to 80 minutes. The resist is exposed to light through a glass mask having the same pattern as the light-receiving surface electrode pattern and developed. The photoresist material used herein may be either positive or negative. The thus patterned substrate is immersed in a hydrofluoric acid aqueous solution of about 1 to 50% by weight or a mixed aqueous solution of hydrofluoric acid and ammonium fluoride, whereby in the case of positive photoresist material, the silicon oxide film 2 is removed only where the photoresist film has been removed. That is, a portion of the silicon oxide film which has the same pattern as the light-receiving surface electrode is lost, forming a diffusion channel 3. Thereafter, the resist film is completely removed by acetone dipping, sulfuric acid boiling or the like (FIG. 3C).

As first diffusion treatment on the light-receiving surface of the substrate, $POCl_3$-containing $N_2$ gas is fed to a hot oven at 900 to 950° C., for carrying out diffusion treatment 4 with phosphorus, Group V element as dopant (FIG. 3D). At this point, phosphorus can be selectively diffused since the oxide film remaining on the surface serves as a mask against phosphorus diffusion. In handling of the substrate, the chamfer and notch on the substrate enables to identify the direction of the substrate and discriminate the front and back surfaces.

It is noted that the above step may also be performed by coating/diffusion or ion implantation.

At the end of the first diffusion treatment, etching is performed with a hydrofluoric acid aqueous solution of about 1 to 50% by weight to remove the surface oxide films (FIG. 3E). When the substrate is transferred from the quartz jig for heat treatment to the cleaning carrier, the chamfer and notch on the substrate enables to identify the direction of the substrate and discriminate the front and back surfaces.

After the oxide films are removed, as second diffusion heat treatment, $POCl_3$-containing $N_2$ gas is fed to a hot oven at 800 to 850° C., for carrying out diffusion treatment 5 with phosphorus, Group V element as dopant in a low concentration over the entire surface (FIG. 3F). The low concentration diffusion layer 5 is formed so as to have a sheet resistance of 50Ω/□ to 300Ω/□, typically 100Ω/□. With this second diffusion heat treatment, the dopant is additionally diffused into the high-concentration diffusion layer 4 pre-formed by the first diffusion heat treatment, which becomes a high-concentration diffusion layer 4 having a sheet resistance of 1Ω/□ to 50Ω/□, typically 10Ω/□. Like the first diffusion treatment, this step may also be performed by coating/diffusion or ion implantation. When the substrate is transferred from the cleaning carrier to the quartz jig for heat treatment, the chamfer and notch on the substrate enables to identify the direction of the substrate and discriminate the front and back surfaces.

At the end of the second diffusion treatment, a silicon nitride film is deposited on the substrate surface by plasma-enhanced CVD as an antireflective film 6 which serves for preventing reflection of sunlight and for surface protection (FIG. 3G).

On the back surface of the substrate having the silicon nitride film formed thereon, a back surface electrode 7 is formed by vacuum deposition or sputtering of aluminum or the like. The back surface electrode 7 is formed, for example, to a thickness of 1 µm to 10 µm, typically 5 µm (FIG. 3H).

Finally, an electrode paste is printed on the front surface and fired at 500 to 800° C. to form an electrode 8 (FIG. 3I). At this point, the finger electrode is formed to overlay the high-concentration diffusion layer. Although the process involving many transfer steps has the problem that it is impossible to discriminate the high-concentration diffusion layer 4 and the low-concentration diffusion layer 5 by visual observation and to identify the direction of the substrate, the provision of chamfer and notch according to the invention enables to set the direction of the substrate in register and thus enables to manufacture solar cells in high yields.

EXAMPLES

Examples of the invention are given below.

First a boron-doped p-type monocrystalline silicon having crystal orientation <100> and a diameter of 200 mm was prepared by the CZ method. The monocrystal was cylindrically polished and measured for crystal orientation by X-ray orientation measurement. An OF was machined in crystal orientation <110>, and a notch was machined at a position that passed the center of the substrate and was rotated 90 degrees with respect to the OF position (FIGS. 1A and 1B).

By cutting off peripheral portions, the cylindrical ingot was worked into a block of pseudo-square shape. This cutting was performed by tilting the ingot at 45 degrees so that the OF machined in <110> direction, i.e., cleavage direction might be positioned at a corner, and cutting the four sides by an outer-diameter saw.

With carbon bonded, a columnar block of pseudo-square shape was sliced by a wire saw into substrates having a thickness of 300 µm. The monocrystalline substrate thus sliced had a shape with an OF and a notch at corners as shown in FIG. 1B. Once a single monocrystalline ingot was machined with an OF and a notch, front and back surfaces of a substrate could be discriminated during substrate handling.

On the surface of the substrate, a silicon oxide film serving as an anti-diffusion layer was formed by thermal oxidation of the substrate in an oxygen atmosphere in a hot oven at 1,000° C. The film thickness was 30 nm (FIG. 3B). Then a positive photoresist material was spin coated to the substrate surface and baked at 70° C. for 20 minutes. The resist was exposed to light through a glass mask having the same pattern as the light-receiving surface electrode pattern and developed. The thus patterned wafer was immersed in a 5 wt % hydrofluoric acid aqueous solution, thereby removing the silicon oxide film only where the photoresist film had been removed. That is, a portion of the oxide film which had the same pattern as the light-receiving surface electrode was lost. Thereafter, the resist was removed by acetone dipping (FIG. 3C).

As first diffusion treatment, POCl$_3$-containing N$_2$ gas was fed to a hot oven at 950° C. for carrying out diffusion treatment with phosphorus, Group V element as dopant (FIG. 3D). At this point, phosphorus was selectively diffused since the oxide film remaining on the surface served as a mask against phosphorus diffusion.

At the end of the first diffusion treatment, etching was performed with a hydrofluoric acid aqueous solution to remove the surface oxide films (FIG. 3E).

After the oxide films were removed, POCl$_3$-containing N$_2$ gas was fed to a hot oven at 800° C. to form a n-type low-concentration diffusion layer (FIG. 3F). A portion where phosphorus was selectively diffused became a high-concentration diffusion layer.

Silicon nitride was deposited on the substrate surface by plasma-enhanced CVD as an antireflective film which served for preventing reflection of sunlight and for surface protection (FIG. 3G).

On the back surface, a back surface electrode of 5 µm thick was formed by vacuum deposition of aluminum (FIG. 3H).

Finally, an electrode paste was printed on the front surface and fired to form an electrode (FIG. 3I). By virtue of the shape of the solar cell-forming substrate according to the invention, the direction of the substrate could be identified from the outer appearance in the transfer and alignment steps. The direction of the substrate could be set in register, enabling to manufacture solar cells in high yields.

REFERENCE SIGNS LIST

1: substrate
2: silicon oxide film
3: diffusion channel
4: high-concentration diffusion layer
5: low-concentration diffusion layer
6: antireflective film
7: back surface electrode
8: front surface electrode

The invention claimed is:

1. A method for manufacturing a solar cell using a silicon substrate of square shape with corners as viewed in plan view, having a first corner and a second corner not diagonal to the first corner, which is provided with a chamfer at the first corner or a notch at or near the first corner and with a notch at or near the second corner or a chamfer at the second corner, the notch or chamfer at the second corner is selected to be different from the chamfer or notch at the first corner,
   wherein the first and second corners are used to identify the direction of the substrate and discriminate the front and back surfaces of the substrate during manufacturing.

2. The method of claim 1, wherein the method includes forming a low-concentration diffusion layer, and a high-concentration diffusion layer on the light-receiving surface of the substrate and forming a finger electrode on the high-concentration diffusion layer,
   wherein forming the high-concentration diffusion layer and the finger electrode are conducted in the state of registration of the substrate in place using the first and second corners to identify the direction of the substrate and discriminate the front and back surfaces of the substrate.

3. The method of claim 2, wherein the high-concentration diffusion layer and the low-concentration diffusion layer are prepared by covering the surface of the substrate with an anti-diffusion coating, removing a portion of the anti-diffusion coating to open diffusion windows which has the same pattern as the finger electrode, selectively diffusing a dopant into the window region, removing the anti-diffusion coating, and diffusing the dopant into the entire surface of the substrate.

4. The method of claim 2, wherein an anti-reflective coating is formed on the high-concentration diffusion layer and the low-concentration diffusion layer, then the finger electrode is formed on the anti-reflective coating.

5. The method of claim 2, wherein the finger electrode is prepared by printing an electrode paste on the light-receiving surface of the substrate and firing the electrode paste.

6. The method of claim 2, wherein the position of the finger electrode is determined by registering the substrate in place using its two sides as the reference, and aligning the finger electrode with the high-concentration diffusion layer.

7. A method of for manufacturing a solar cell using a monocrystalline silicon substrate of square shape with rounded corners as viewed in plan view, which is provided with an orientation flat at a first corner or and a notch at or near a second corner not diagonal to the first corner, wherein the first and second corners are used to identify the direction of the substrate and discriminate the front and back surfaces of the substrate during manufacturing.

8. A method of for manufacturing a solar cell of claim 7, wherein the silicon substrate has a surface in (100) plane, which substrate is provided with the orientation flat and the notch in a crystal orientation <110> passing substantially the center of the substrate.

9. The method of claim 8, wherein the method includes forming a low-concentration diffusion layer, and a high-concentration diffusion layer on the light-receiving surface of the substrate and forming a finger electrode on the high-concentration diffusion layer,
wherein forming the high-concentration diffusion layer and the finger electrode are conducted in the state of registration of the substrate in place using the first and second corners to identify the direction of the substrate and discriminate the front and back surfaces of the substrate.

10. The method of claim 7, wherein the method includes forming a low-concentration diffusion layer, and a high-concentration diffusion layer on the light-receiving surface of the substrate and forming a finger electrode on the high-concentration diffusion layer,
wherein forming the high-concentration diffusion layer and the finger electrode are conducted in the state of registration of the substrate in place using the first and second corners to identify the direction of the substrate and discriminate the front and back surfaces of the substrate.

11. The method of claim 10, wherein the high-concentration diffusion layer and the low-concentration diffusion layer are prepared by covering the surface of the substrate with an anti-diffusion coating, removing a portion of the anti-diffusion coating to open diffusion windows which has the same pattern as the finger electrode, selectively diffusing a dopant into the window region, removing the anti-diffusion coating, and diffusing the dopant into the entire surface of the substrate.

12. The method of claim 10, wherein an anti-reflective coating is formed on the high-concentration diffusion layer and the low-concentration diffusion layer, then the finger electrode is formed on the anti-reflective coating.

13. The method of claim 10, wherein the finger electrode is prepared by printing an electrode paste on the light-receiving surface of the substrate and firing the electrode paste.

14. The method of claim 10, wherein the position of the finger electrode is determined by registering the substrate in place using its two sides as the reference, and aligning the finger electrode with the high-concentration diffusion layer.

15. The method of claim 7, wherein the substrate is manufactured from a cylindrical monocrystalline ingot, and the rounded corners of the substrate are the peripheral portion of the ingot.

* * * * *